(12) United States Patent
Chen et al.

(10) Patent No.: US 11,942,385 B2
(45) Date of Patent: Mar. 26, 2024

(54) SEMICONDUCTOR PACKAGE STRUCTURE

(71) Applicant: Advanced Semiconductor Engineering, Inc., Kaohsiung (TW)

(72) Inventors: Sheng-Yu Chen, Kaohsiung (TW); Chang-Lin Yeh, Kaohsiung (TW); Ming-Hung Chen, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 0 days.

(21) Appl. No.: 17/707,803

(22) Filed: Mar. 29, 2022

(65) Prior Publication Data
US 2022/0223489 A1 Jul. 14, 2022

Related U.S. Application Data

(63) Continuation of application No. 16/725,307, filed on Dec. 23, 2019, now Pat. No. 11,289,394.

(51) Int. Cl.
*H01L 23/31* (2006.01)
*H01L 21/56* (2006.01)
*H01L 23/00* (2006.01)
*H01L 23/29* (2006.01)
*H01L 23/538* (2006.01)
*H01L 25/065* (2023.01)

(52) U.S. Cl.
CPC ........ *H01L 23/3135* (2013.01); *H01L 21/565* (2013.01); *H01L 23/291* (2013.01); *H01L 23/295* (2013.01); *H01L 23/3121* (2013.01); *H01L 23/5387* (2013.01); *H01L 24/16* (2013.01); *H01L 24/81* (2013.01); *H01L 25/0652* (2013.01); *H01L 2224/16227* (2013.01); *H01L 2225/06517* (2013.01); *H01L 2225/06572* (2013.01); *H01L 2924/351* (2013.01)

(58) Field of Classification Search
None
See application file for complete search history.

(56) References Cited

U.S. PATENT DOCUMENTS

| 8,680,688 | B2 * | 3/2014 | Kang | H01L 23/49811 |
| | | | | 257/E23.024 |
| 10,157,887 | B2 | 12/2018 | Chen et al. | |
| 10,217,728 | B2 * | 2/2019 | Appelt | H01L 25/105 |

(Continued)

OTHER PUBLICATIONS

Non-Final Office Action for U.S. Appl. No. 16/725,307, dated Jun. 25, 2021, 9 pages.

(Continued)

*Primary Examiner* — Long Pham
(74) *Attorney, Agent, or Firm* — FOLEY & LARDNER LLP

(57) ABSTRACT

A semiconductor package includes a substrate having a first side and a second side opposite to the first side, a first type semiconductor die disposed on the first side of the substrate, a first compound attached to the first side and encapsulating the first type semiconductor die, and a second compound attached to the second side, causing a stress with respect to the first type semiconductor die in the first compound. A method for manufacturing the semiconductor package described herein is also disclosed.

14 Claims, 7 Drawing Sheets

(56) References Cited

U.S. PATENT DOCUMENTS

| | | |
|---|---|---|
| 2006/0204776 A1 | 9/2006 | Chen et al. |
| 2009/0029048 A1 | 1/2009 | Chen et al. |
| 2010/0102438 A1 | 4/2010 | Watanabe et al. |
| 2016/0056058 A1* | 2/2016 | Haba .................. G01R 31/2886 438/126 |

OTHER PUBLICATIONS

Notice of Allowance for U.S. Appl. No. 16/725,307, dated Nov. 30, 2021, 5 pages.

* cited by examiner

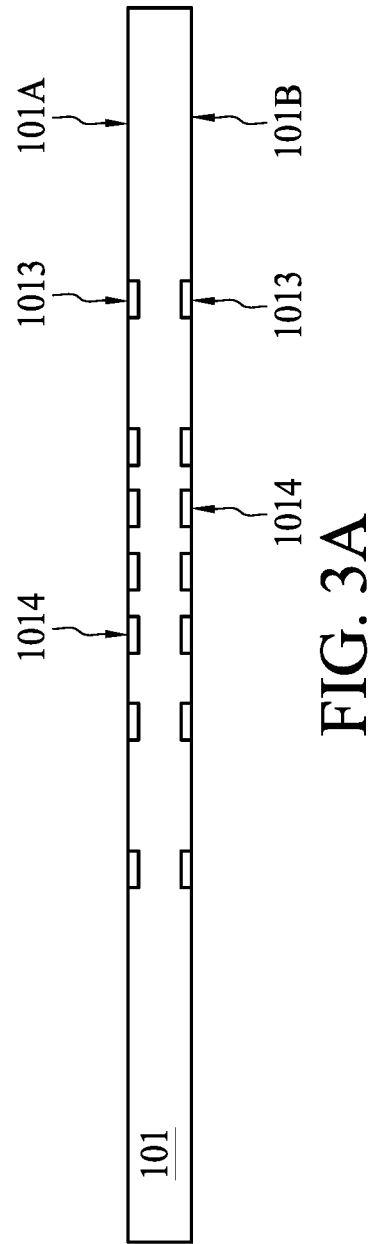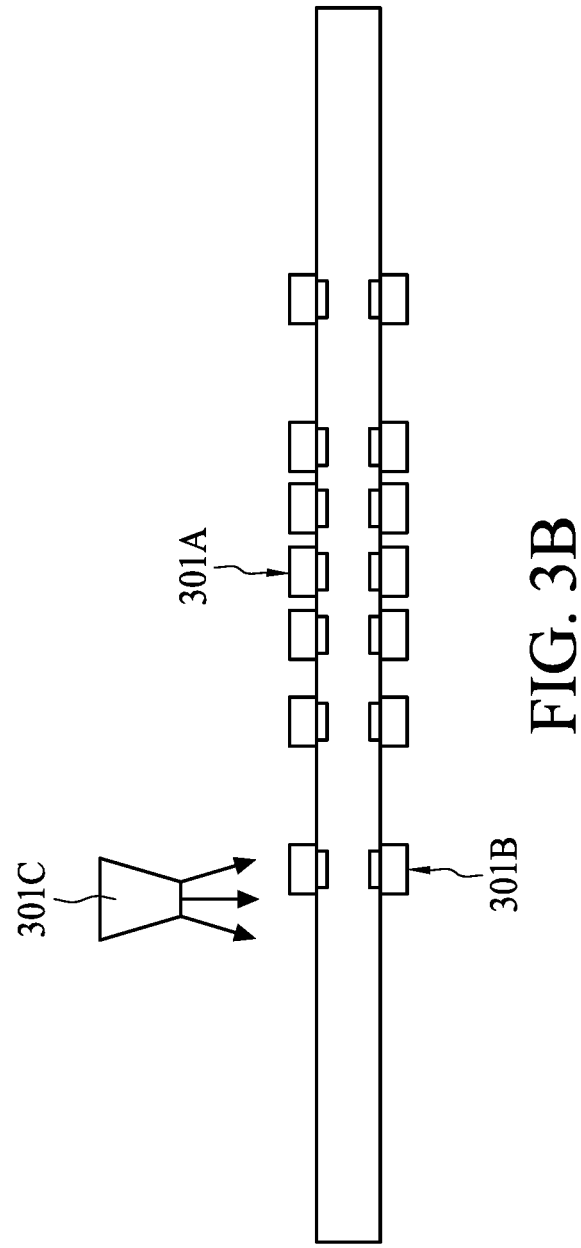

SEMICONDUCTOR PACKAGE STRUCTURE

CROSS-REFERENCE TO RELATED APPLICATIONS

The present application is continuation of U.S. patent application Ser. No. 16/725,307 filed Dec. 23, 2019, now U.S. Pat. No. 11,289,394, the contents of which are incorporated by reference herein in its entirety.

BACKGROUND

1. Technical Field

The present disclosure relates to a semiconductor package having a pre-stressed flexible structure.

2. Description of the Related Art

To adapt for the development of wearable communication devices, volume reduction (e.g., thinning), manufacturing cost reduction, function flexibility, and expedited product cycle are important to device packaging.

Comparative wearable communication device includes components such as display, system-in-package (SiP), and battery. The I/O of the SiP connects to the display through flexible substrate and being disposed under the display. A housing is added to protect the SiP and flexible substrate. The thickness and the stiffness of the housing affect the wearability of the wearable communication device, for example, as it may not conform to the wrist of the user. However, if the housing is removed and embedding the display, SiP, and battery into the flexible strap, external force can directly impact the die and pose potential damage to the product.

SUMMARY

In some embodiments, the present disclosure provides a semiconductor package, including a substrate having a first side and a second side opposite to the first side, a first type semiconductor die disposed on the first side of the substrate, a first compound attached to the first side and encapsulating the first type semiconductor die, and a second compound attached to the second side, causing a stress with respect to the first type semiconductor die in the first compound.

In some embodiments, the present disclosure provides a semiconductor package structure, including a substrate having a first side and a second side opposite to the first side, a first type semiconductor die disposed on the first side of the substrate, a first compound having a negative coefficient of thermal expansion (CTE) attached to the first side and encapsulating the first type semiconductor die, and a second compound having a positive CTE attached to the second side.

In some embodiments, the present disclosure provides a method for manufacturing a semiconductor package, the method including providing a substrate having a first side and a second side opposite to the first side, disposing a first type semiconductor die on the first side of the substrate, forming a first compound attached to the first side and encapsulating the first type semiconductor die, forming a second compound attached to the second side, and adjusting a temperature of the first compound and the second compound so that the second compound causing a stress with respect to the first type semiconductor die in the first compound.

BRIEF DESCRIPTION OF THE DRAWINGS

Aspects of the present disclosure are readily understood from the following detailed description when read with the accompanying figures. It should be noted that various features may not be drawn to scale. In fact, the dimensions of the various features may be arbitrarily increased or reduced for clarity of discussion.

FIG. 3A, FIG. 3B, FIG. 3C, FIG. 3D, and FIG. 3E illustrate cross sectional views of intermediate products in various stages of manufacturing a semiconductor package, according to some embodiments of the present disclosure.

DETAILED DESCRIPTION

Figure 1:
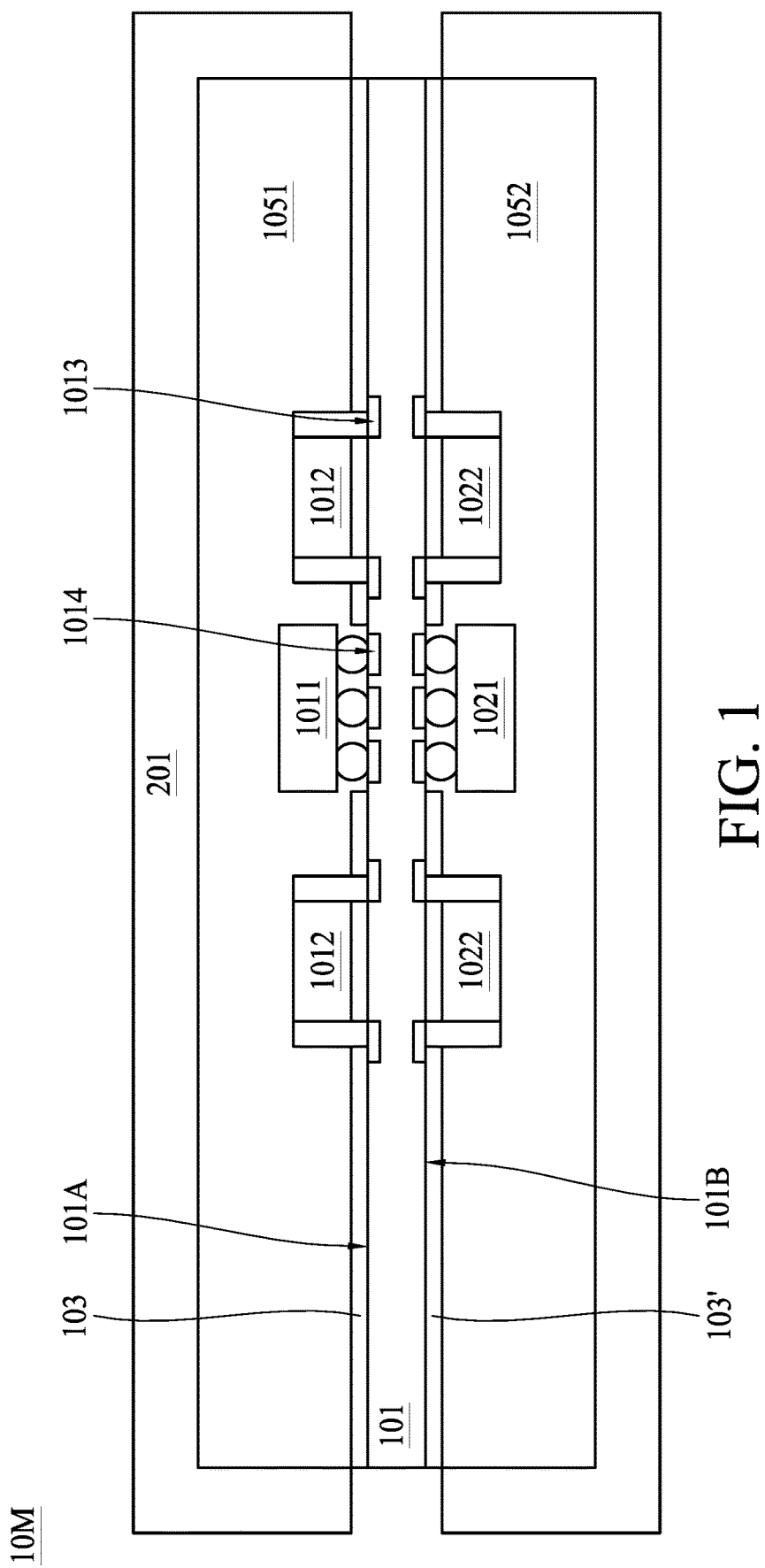
FIG. 1 illustrates a cross-sectional view of a semiconductor package in a mold chase according to some embodiments of the present disclosure.

Common reference numerals are used throughout the drawings and the detailed description to indicate the same or similar components. Embodiments of the present disclosure will be readily understood from the following detailed description taken in conjunction with the accompanying drawings.

Spatial descriptions, such as "above," "below," "up," "left," "right," "down," "top," "bottom," "vertical," "horizontal," "side," "higher," "lower," "upper," "over," "under," and so forth, are specified with respect to a certain component or group of components, or a certain plane of a component or group of components, for the orientation of the component(s) as shown in the associated figure. It should be understood that the spatial descriptions used herein are for purposes of illustration only, and that practical implementations of the structures described herein can be spatially arranged in any orientation or manner, provided that the merits of embodiments of this disclosure are not deviated from by such arrangement.

Present disclosure provides a package structure capable of protecting the die from the impact of external force by possessing a pre-formed stress (or a "pre-stressed" semiconductor package structure referred herein). The pre-formed stress is achieved by assembling two molding compounds with different coefficient of thermal expansions (CTEs).

The semiconductor package described in the present disclosure includes a first molding compound having a first CTE smaller than a second CTE of a second molding compound. The first molding compound attached to a first side of a flexible substrate, and the second molding compound attached to a second side of the flexible substrate. Prior to demolding (e.g., removing the molded semiconductor package from the mold chase), the first molding compound and the second molding compound are cooled down to room temperature, and due to the mold chase constraint, the two molding compounds cannot freely deform according to their thermal expansion properties, respectively. The first molding compound is experiencing a compression stress exerted from the second molding compound, and vice versa, the second molding compound is experiencing a tensile stress exerted from the first molding compound. After demolding (e.g., removing the molded semiconductor package from the mold chase), the two molding compounds may freely deform with the compression stress being the pre-formed stress in the first molding compound, and the tensile stress being the pre-formed stress in the second molding compound.

Referring to FIG. 1, FIG. 1 illustrates a cross-sectional view of a semiconductor package 10M in a mold chase 201 according to some embodiments of the present disclosure. The semiconductor package 10M includes a substrate 101 having a first side 101A and a second side 101B opposite to the first side 101A. In some embodiments, the substrate 101 may be a flexible film substrate, including a flexible film having die attaching areas for carrying the first type semiconductor dies 1011, 1012, and second type semiconductor dies 1021, 1022. The first side 101A of the substrate 101 is provided with a plurality of die connection pads 1013, and/or a plurality of solder pads 1014. The die connection pads 1013 and the solder pads 1014 are arranged about the periphery of each of the die attaching area. In some embodiments, the substrate 101 has a plurality of through connections (not shown in FIG. 1) formed corresponding to the solder pads 1014 and the die connection pads 1013 in order to electrically connect the first type semiconductor dies 1011, 1012 on the first side 101A to the second type semiconductor dies 1021, 1022 on the second side 101B.

A package body is composed of a first compound 1051 and a second compound 1052. The first compound 1051 is formed over the first type semiconductor dies 1011, 1012 and the first side 101A of the substrate 101. The first compound 1051 encapsulates the first type semiconductor dies 1011, 1012, and may form a molded underfill (MUF) between the first type semiconductor dies 1011, 1012 and the first side 101A. The second compound 1052 is formed over the second type semiconductor dies 1021, 1022 and the second side 101B of the substrate 101 and may form a molded underfill (MUF) between the second type semiconductor dies 1021, 1022 and the second side 101B. The second compound 1052 encapsulates the second type semiconductor dies 1021, 1022. In some embodiments, the second compound 1052 is configured to cause a stress to the first type semiconductor dies 1011, 1012 over the first side 101A of the substrate 101.

In order to cause the stress to the first type semiconductor dies 1011, 1012, in some embodiments, the first compound 1051 is composed of materials having a negative coefficient of thermal expansion (CTE), while the second compound 1052 is composed of materials having a positive CTE. During the molding operation, temperature of the molding materials is brought up to greater than 150 degrees Celsius, for example, in a range of from about 170 degrees Celsius to about 180 degrees Celsius, and then cooled down to about room temperature (e.g., 25 degrees Celsius). Due to the aforesaid temperature decrease, materials with negative CTE may expand at least in a linear dimension whereas materials with positive CTE may contract at least in the same linear dimension. Because the first compound 1051 and the second compound 1052 are attached to the inner sidewall of the mold chase 201, the first compound 1051 and the second compound 1052 may not demonstrate any observable deformation until demolded (e.g., removing the first compound 1051 and the second compound 1052 from the mold chase 201).

Figure 2:
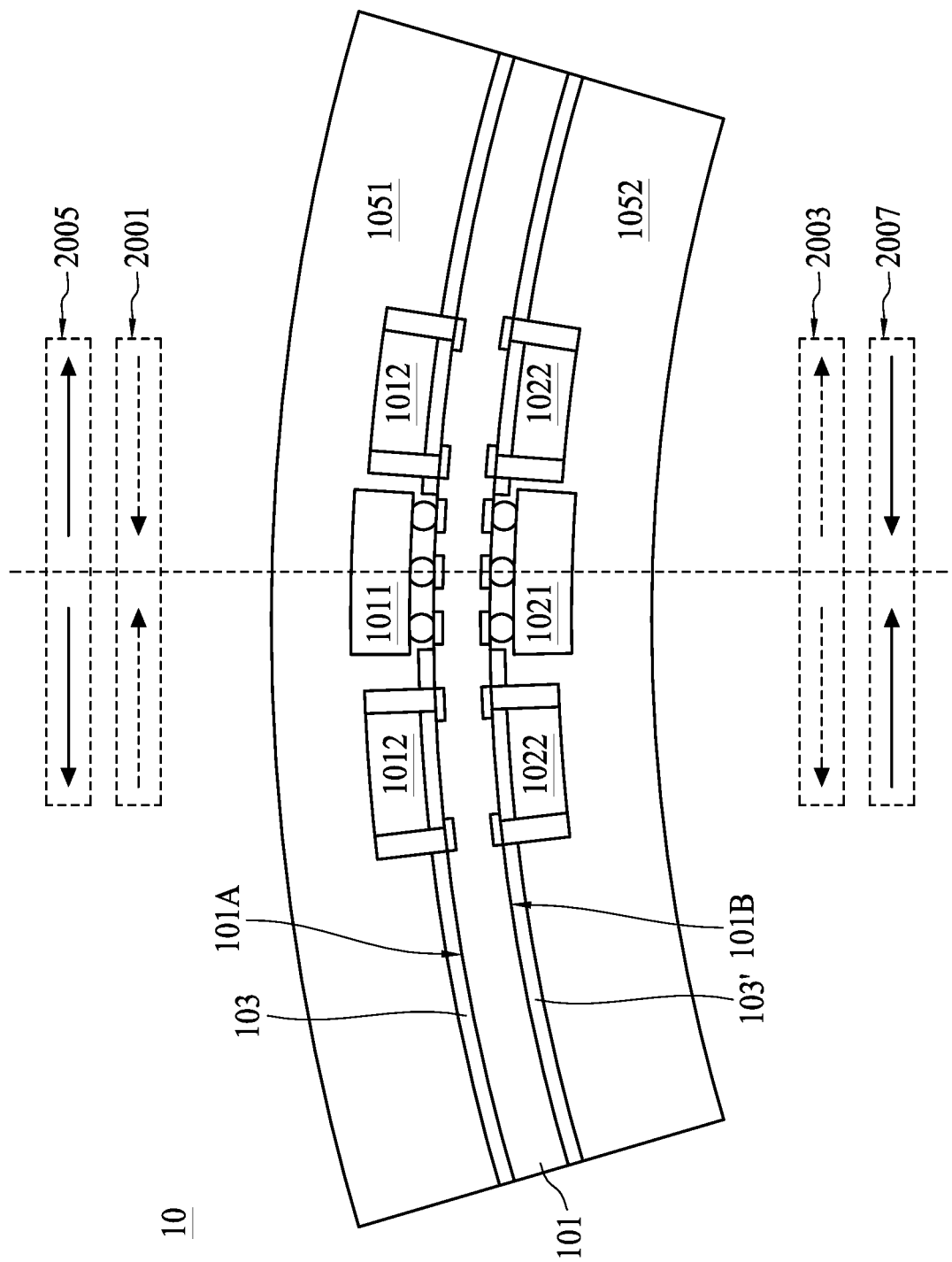
FIG. 2 illustrates a cross-sectional view of a semiconductor package removed from a mold chase according to some embodiments of the present disclosure.

Referring to FIG. 2, FIG. 2 illustrates a cross-sectional view of a semiconductor package 10 removed from a mold chase according to some embodiments of the present disclosure. In FIG. 2, in absence of the constraint of the mold chase and as a result of the aforesaid temperature decrease, the first compound 1051 may freely expand and the second compound 1052 may freely contract according to their respective CTEs. As shown in FIG. 2, the first compound 1051 and the second compound 1052 are deformed to have a upside-down "U" shape, where the first compound 1051 is experiencing a compression stress exerted by the second compound 1052 and vice versa, the second compound 1052 is experiencing a tensile stress exerted by the first compound 1051. The compression stress experienced by the first compound 1051, and thence the first type semiconductor dies 1011, 1012 encapsulated by the first compound 1051, is referred to as a pre-formed compression stress 2001 in the present disclosure. The tensile stress experienced by the second compound 1052, and thence the second type semiconductor dies 1021, 1022 encapsulated by the second compound 1052, is referred to as a pre-formed tensile stress 2003 in the present disclosure. Alternatively stated, by exploiting the CTEs of the first compound 1051 and the second compound 1052, pre-formed compression stress 2001 can exerts a compression force to the first type semiconductor dies 1011, 1012, and the pre-formed tensile stress 2003 can exerts a tensile force to the second type semiconductor dies 1021, 1022 in the absence of any external force.

In some embodiments, materials with negative CTEs may be metal oxides, including but not limited to, $AM_2O_8$ (where A can be Zr, Hf and M can be W, Mo), $Zn(CN)_2$, $A_2(MO_4)_3$ (where A can be Sc, Y, Lu, and the like, and M can be W, Mo), $Cu_2O$, $Ag_2O$, $ZrV_2O_7$, $ZrP_2O_7$, $NbOPO_4$, and the like. In some embodiments, the materials with negative CTEs can be mixed into epoxy-based materials as a form of fillers, so as to obtain the first compound 1051 described in the present disclosure. In some embodiments, the materials with negative CTEs can be deposited over the first side 101A of the substrate 101 using plasma-enhanced chemical vapor deposition (PECVD). In some embodiments, the materials with negative CTEs can be laminated over the first side 101A of the substrate 101.

Referring to FIG. 2, the first type semiconductor dies 1011, 1012 are experiencing the pre-formed compression stress 2001 in the absence of any external force. In some embodiments, the first type semiconductor dies 1011, 1012 are selected from semiconductor dies that are more compression endurable than tensile endurable. For example, the first type semiconductor dies 1011, 1012 may include a die having a planar area greater than or equal to about 4 mm by 4 mm, a die having a thickness greater than or equal to about 0.05 mm, and/or an active device including, but not limited to, a power management integrated circuit (PMIC), an application processor (AP), or a memory.

Referring to FIG. 2, the second type semiconductor dies 1021, 1022 are experiencing the pre-formed tensile stress 2003 in the absence of any external force. In some embodiments, the second type semiconductor dies 1021, 1022 are selected from semiconductor dies that are more tensile endurable than compression endurable. For example, the second type semiconductor dies 1021, 1022 may include a die having a planar area smaller than about 4 mm by 4 mm, a die having a thickness thinner than about 0.05 mm, a passive device, a sensor, a radio frequency (RF) device, or a front-end module.

Referring to FIG. 1 and FIG. 2, a solder mask layer 103 is disposed between the first side 101A of the substrate 101 and the first compound 1051. Similarly, a solder mask layer 103' is disposed between the second side 101B of the substrate 101 and the second compound 1052. The solder mask layer 103, 103' is coated over the first side 101A and/or the second side 101B in order to provide isolation between die carrying regions and to prevent overflow of the solder. In some embodiments, the solder mask layer 103 is in direct contact with the first compound 1051, and the solder mask layer 103' is in direct contact with the second compound 1052.

In some embodiments, a display may be disposed in the first compound 1051 over the first side 101A of the substrate 101 and electrically connected to the first type semiconductor dies 1011, 1012, and/or the second type semiconductor dies 1021, 1022. In some embodiments, the display is disposed further from the first side 101A than the first type semiconductor dies 1021, 1022 do. In some embodiments, the display may be laterally encapsulated and partially exposed from the first compound 1051 at its top surface. Alternatively stated, the display ZZZ is disposed in a compound layer experiencing a pre-formed compression stress. In some embodiments, the display may be free from encapsulation of the first compound 1051 by disposing over a top surface of the first compound 1051.

Referring to FIG. 2, when user's wrist is in contact with the second compound 1052, an external force of bending may be exerted to the first compound 1051 and the second compound 1052. Specifically, a tensile stress 2005 may be imposed on first compound 1051 while a compression stress 2007 may be imposed on the second compound 1052. In this connection, the tensile stress 2005 may be imposed to the first semiconductor dies 1011, 1021 in the first compound 1051 while the compression stress 2007 may be imposed to the second semiconductor dies 1021, 1022 in the second compound 1052. To some extent, the pre-formed compression stress 2001 in the first compound 1051 can counter balance the external tensile stress 2005 exerted by the user, and the pre-formed tensile stress 2003 in the second compound 1052 can counter balance the external compression stress 2007 exerted by the user. Examples of the tensile and compression stress balance may be addressed in FIG. 4A and FIG. 4B of the present disclosure.

Figure 3C:
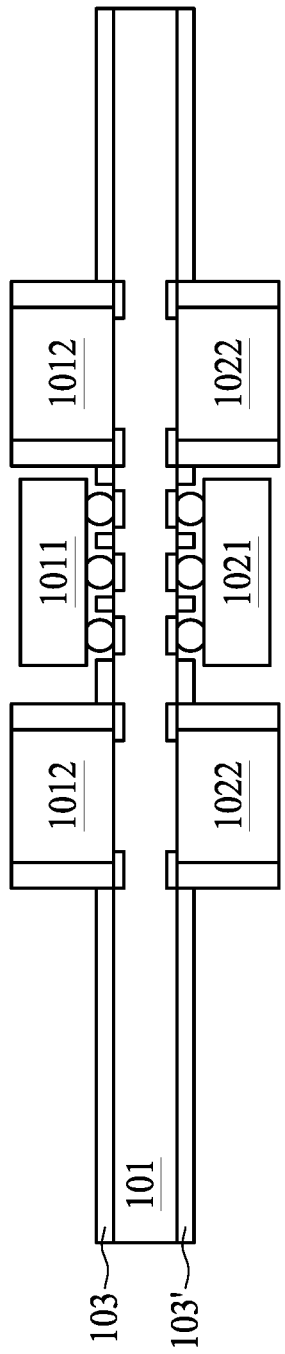

Referring to FIG. 3A to FIG. 3E, FIG. 3A to FIG. 3E illustrate cross sectional views of intermediate products in various stages of manufacturing a semiconductor package, according to some embodiments of the present disclosure. In FIG. 3A, a substrate 101 having a first side 101A and a second side 101B is provided. A plurality of solder pads 1014 and the die connection pads 1013 are disposed over the first side 101A and the second side 101B of the substrate 101.

In FIG. 3B, a stencil mask 301A is provided over the first side 101A, covering the plurality of solder pads 1014 and the die connection pads 1013. Similarly, a stencil mask 301B is provided over the second side 101B, covering the plurality of solder pads 1014 and the die connection pads 1013. A spray coater 301C is provided to scan through the first side 101A and the second side 101B of the substrate 101 in order to provide a first solder mask layer 103 over the first side 101A and a second solder mask layer 103' over the second side 101B. Subsequently, the stencil masks 301A and 301B are removed.

In FIG. 3C, a plurality of first type semiconductor dies 1011, 1012 are disposed over the first side 101A and electrically connected to the solder pads 1014 and the die connection pads 1013 on the first side 101A. In some embodiments, the first type semiconductor dies 1011, 1012 can be flip-chip bonded to the first side 101A. In some other embodiments, the first type semiconductor dies 1011, 1012 can be disposed over the first side 101A using any suitable surface mounting techniques. Similarly, a plurality of second type semiconductor dies 1021, 1022 are disposed over the second side 101B and electrically connected to the solder pads 1014 and the die connection pads 1013 on the second side 101B. In some embodiments, the second type semiconductor dies 1021, 1022 can be flip-chip bonded to the second side 101B. In some other embodiments, the second type semiconductor dies 1021, 1022 can be disposed over the second side 101B using any suitable surface mounting techniques. Suitable reflow operations may be performed to complete the surface mounting. As previously described, the first type semiconductor dies 1011, 1012 may be more compression endurable than tensile endurable. For example, the first type semiconductor dies 1011, 1012 may include a die having a planar area greater than or equal to about 4 mm by 4 mm, a die having a thickness greater than or equal to about 0.05 mm, and/or an active device including, but not limited to, a power management integrated circuit (PMIC), an application processor (AP), or a memory. The second type semiconductor dies 1021, 1022 may be more tensile endurable than compression endurable. For example, the second type semiconductor dies 1021, 1022 may include a die having a planar area smaller than about 4 mm by 4 mm, a die having a thickness thinner than about 0.05 mm, a passive device, a sensor, a radio frequency (RF) device or a front end module.

Figure 3D:
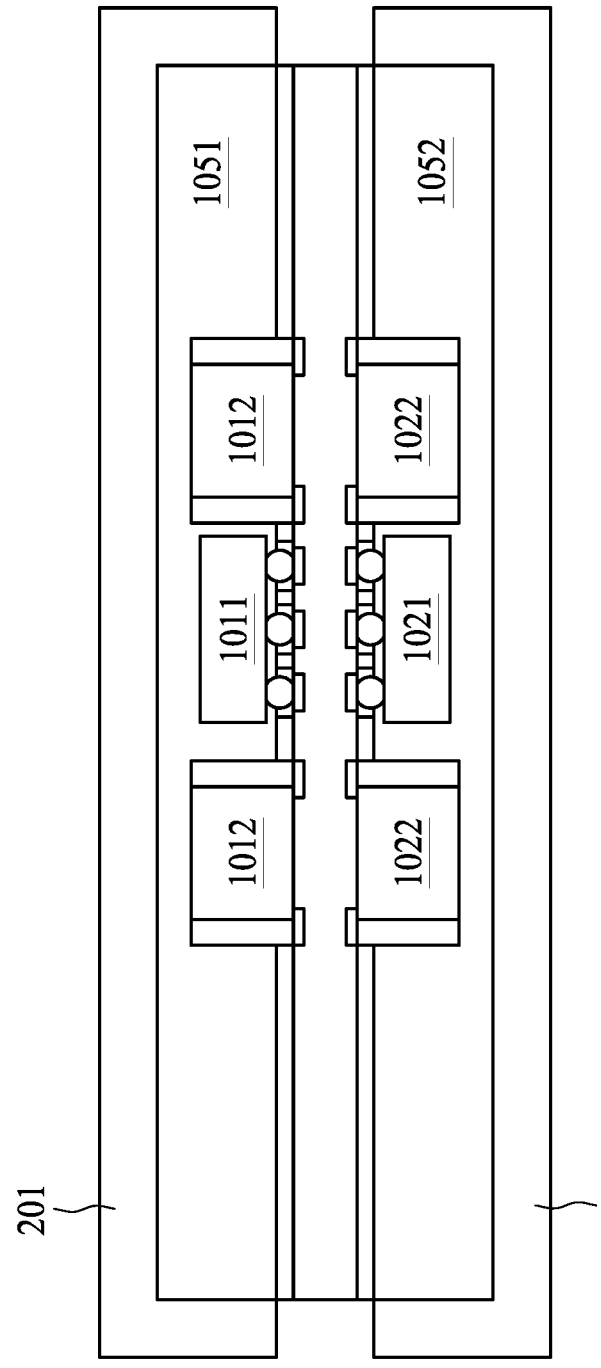

In FIG. 3D, the first compound 1051 is formed to encapsulate the first type semiconductor dies 1011, 1012, over the first side 101A by a molding operation. Concurrently or subsequently, the second compound 1052 is formed to encapsulate the second type semiconductor dies 1021, 1022, over the second side 101B by a molding operation. In some embodiments, the first compound 1051 and the second compound 1052 are formed by a double side molding operation where the first compound 1051 and the second compound 1052 are injected into a mold chase 201, elevating the temperature of the first compound 1051 and the second compound 1052 to a temperature greater than about 150 degrees Celsius, for example, in a range of from about 170 to about 180 degrees Celsius, and then subsequently reduce the temperature of the first compound 1051 and the second compound 1052 to room temperature (e.g., 25 degree Celsius). The aforesaid temperature elevation and reduction are conducted without demold.

Figure 3E:
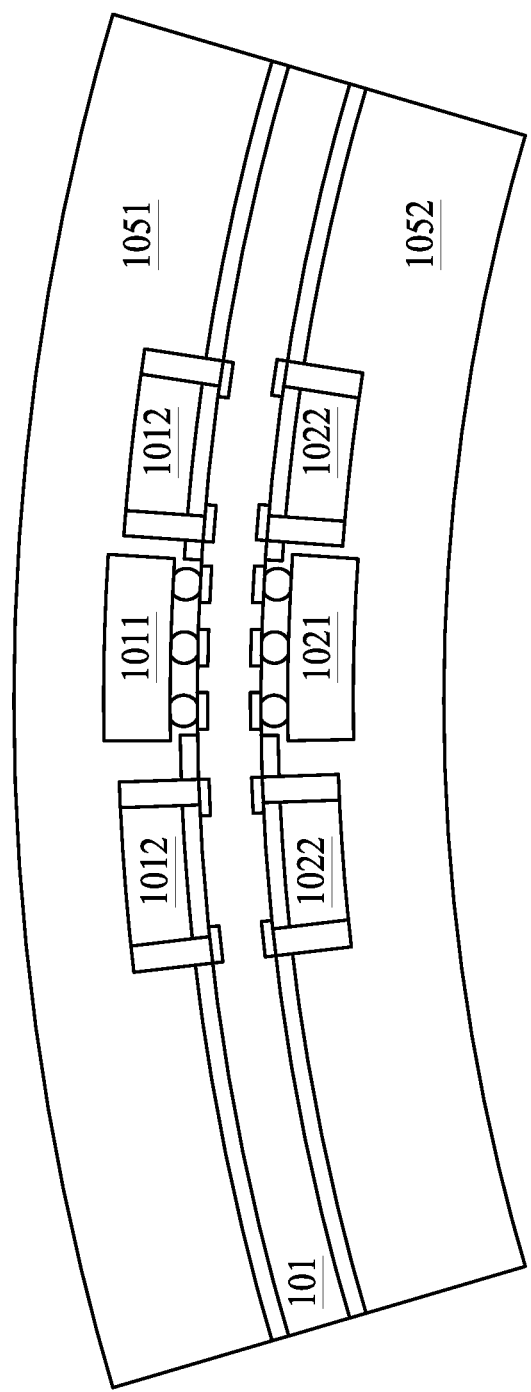

As previously described, the first compound 1051 is composed of materials having a negative coefficient of thermal expansion (CTE), while the second compound 1052 is composed of materials having a positive CTE. The first compound 1051 and the second compound 1052 may not deform prior to demolding. After demolding (e.g., removing the semiconductor package from the mold chase 201), the first compound 1051 expands and the second compound 1052 contact, causing the first compound 1051 to experience the pre-formed compression stress exerted by the second compound 1052 and vice versa, causing the second compound 1052 to experience the pre-formed tensile stress exerted by the first compound 1051, as shown in FIG. 3E. In some embodiments, the first compound 1051 and the second compound 1052 are deformed to have a upside-down "U"

shape, thereby the pre-formed compression stress is imposed on the first type semiconductor dies 1011, 1012 in the first compound 1051, and the pre-formed tensile stress is imposed on the second type semiconductor dies 1021, 1022 in the second compound 1052. In some embodiments, the first compound 1051 has a thickness greater than any of the first type semiconductor dies 1011, 1012. Similarly, the second compound 1052 has a thickness greater than any of the second type semiconductor dies 1021, 1022.

Figure 4A:
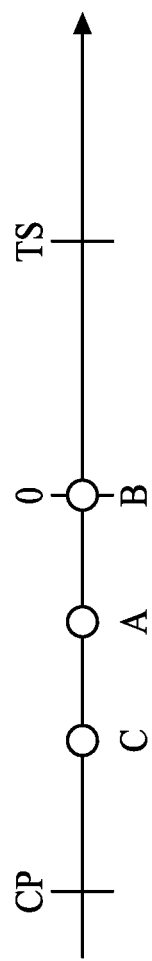
FIG. 4A shows a schematic diagram of change of stress applied to the first type semiconductor dies at various conditions, according to some embodiments of the present disclosure.

FIG. 4A shows a schematic diagram of change of stress applied to the first type semiconductor dies at various conditions, according to some embodiments of the present disclosure. FIG. 4A shows the stress being imposed on the first type semiconductor dies 1011, 1012 in the first compound 1051 under three conditions: (A) when no external force (e.g., from the user) imposed on the semiconductor package; (B) when a moderate external force (e.g., from the user) imposed on the semiconductor package; (C) when an abnormal external force (e.g., from the user) imposed on the semiconductor package.

Under condition (A), the pre-formed compression stress may cause the first compound 1051 or the first type semiconductor dies 1011, 1012 to experience a compression stress between stress neutral "0" and compression stress limit "CP". The semiconductor package and the semiconductor dies therein may suffer permanent deformation or cracks when a stress beyond compression stress limit CP is imposed. Under condition (B), when a user is wearing a wearable device composed of the semiconductor package described herein with the second compound 1052 side in contact with his or her wrist, a moderate tensile stress is applied to the first compound 1051 and the first type semiconductor dies 1011, 1012. The pre-formed compression stress originally experienced by the first compound 1051 and the first type semiconductor dies 1011, 112 is counter balanced by such tensile stress and the net stress in the first compound 1051 may be close to stress neutral 0. Under condition (C), when a user is wearing a wearable device composed of the semiconductor package described herein with the first compound 1051 side in contact with his or her wrist, that is, opposite to the normal wearing condition, an abnormal compression stress is imposed on the first compound 1051 as well as the first type semiconductor dies 1011, 1021 therein. The abnormal compression stress may add to the pre-formed compression stress and causing the net stress to move closer to compression stress limit CP. However, since the first type semiconductor dies 1011, 1021 are more compression endurable than tensile endurable, such abnormal compression stress may not cause package or device failure by reaching the compression stress limit CP.

Figure 4B:
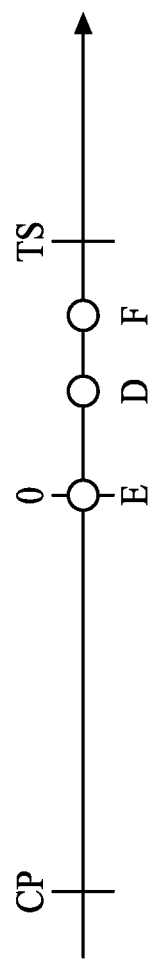
FIG. 4B shows a schematic diagram of change of stress applied to the second type semiconductor dies at various conditions, according to some embodiments of the present disclosure.

FIG. 4B shows a schematic diagram of change of stress applied to the second type semiconductor dies at various conditions, according to some embodiments of the present disclosure. FIG. 4B shows the stress being imposed on the second type semiconductor dies 1021, 1022 in the second compound 1052 under three conditions: (D) when no external force (e.g., from the user) imposed on the semiconductor package; (E) when a moderate external force (e.g., from the user) imposed on the semiconductor package; (F) when an abnormal external force (e.g., from the user) imposed on the semiconductor package.

Under condition (D), the pre-formed tensile stress may cause the second compound 1052 or the second type semiconductor dies 1021, 1022 to experience a tensile stress between stress neutral "0" and tensile stress limit "TS". The semiconductor package and the semiconductor dies therein may suffer permanent deformation or cracks when a stress beyond tensile stress limit TS is imposed. Under condition (E), when a user is wearing a wearable device composed of the semiconductor package described herein with the second compound 1052 side in contact with his or her wrist, a moderate compression stress is applied to the second compound 1051 and the second type semiconductor dies 1021, 1022. The pre-formed tensile stress originally experienced by the second compound 1052 and the second type semiconductor dies 1021, 1022 is counter balanced by such compression stress and the net stress in the second compound 1052 may be close to stress neutral 0. Under condition (F), when a user is wearing a wearable device composed of the semiconductor package described herein with the first compound 1051 side in contact with his or her wrist, that is, opposite to the normal wearing condition, an abnormal tensile stress is imposed on the second compound 1052 as well as the second type semiconductor dies 1021, 1022 therein. The abnormal tensile stress may add to the pre-formed tensile stress and causing the net stress to move closer to tensile stress limit TS. However, since the second type semiconductor dies 1021, 1022 are more tensile endurable than compression endurable, such abnormal tensile stress may not cause package or device failure by reaching the tensile stress limit TS.

Figure 5:
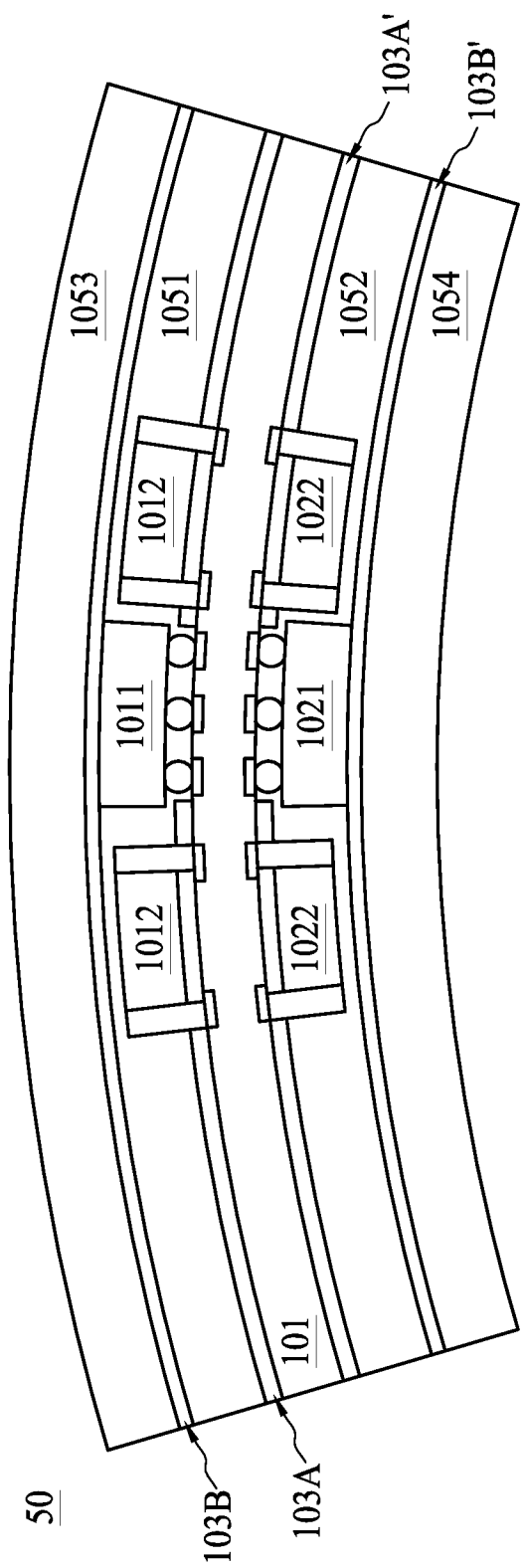
FIG. 5 illustrates a cross-sectional view of a semiconductor package removed from a mold chase according to some embodiments of the present disclosure.

FIG. 5 illustrates a cross-sectional view of a semiconductor package 50 removed from a mold chase according to some embodiments of the present disclosure. The semiconductor package 50 is similar to the semiconductor package 10 except for a graded CTE configuration. For example, a third compound 1053 is stacked with the first compound 1051 over the first side 101A of the substrate 101, and a fourth compound 1054 is stacked with the second compound 1052 over the second side 101B of the substrate 101. In some embodiments, the third compound 1053 is having a CTE more negative than the first compound 1051, while the fourth compound 1054 is having a CTE more positive than the second compound 1052. With the graded CTE configuration, the pre-formed compression stress and pre-formed tensile stress can be better deigned to counter-balance the external force when a user wearing the wearable device composed of the semiconductor package described herein. In some embodiments, more compound layer may be stacked over the first side 101A and the second side 101B of the substrate 101 in order to achieve the preformed stress desired.

As illustrated in FIG. 5, a solder mask layer 103A is between the substrate 101 and the first compound 1051, and a solder mask layer 103B is between the first compound 1051 and the third compound 1053. A solder mask layer 103A' is between the substrate 101 and the second compound 1052, and a solder mask layer 103B' is between the second compound 1052 and the fourth compound 1054.

Referring to FIG. 3D, FIG. 3E, and FIG. 5, after the demolding operation, a third compound 1053 and a fourth compound 1054 described in FIG. 5 may be formed using a subsequent double side molding operation. Suitable bending or flattening procedure may be performed to the semiconductor package as illustrated in FIG. 3E prior to subsequent double side molding operation since the first compound 1051 and the second compound 1052 may freely expand and contact after demolding.

As used herein and not otherwise defined, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. The term "substantially coplanar" can refer to two surfaces within micrometers of lying along a same plane, such as within 40 μm, within 30 μm, within 20 μm, within 10 μm, or within 1 μm of lying along the same plane.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A semiconductor package, comprising:
   a substrate having a first side and a second side opposite to the first side;
   a first semiconductor die disposed on the first side of the substrate;
   a second semiconductor die disposed on the second side of the substrate;
   a first compound encapsulating the first semiconductor die;
   a second compound encapsulating the second semiconductor die; and
   a display disposed over a first side of the substrate and electrically connected to the first semiconductor dies, wherein the display is laterally encapsulated by the first compound, and wherein a top surface of the display is at least partially exposed from the first compound.

2. The semiconductor package of claim 1, wherein the semiconductor package is a flexible structure.

3. The semiconductor package of claim 1, wherein the display is disposed over a top surface of the first compound.

4. The semiconductor package of claim 1, wherein the first compound is composed of materials having a first coefficient of thermal expansion (CTE), and wherein the second compound is composed of materials having a second CTE greater than the first CTE.

5. The semiconductor package of claim 1, wherein the first semiconductor die is more compression endurable than tensile endurable.

6. The semiconductor package of claim 1, wherein the second semiconductor die is more tensile endurable than compression endurable.

7. A semiconductor package, comprising:
   a substrate having a first side and a second side opposite to the first side;
   a first semiconductor die disposed on the first side of the substrate;
   a second semiconductor die disposed on the second side of the substrate;
   a first compound encapsulating the first semiconductor die; and
   a second compound encapsulating the second semiconductor die,
   wherein the first compound is composed of materials having a negative coefficient of thermal expansion (CTE), and wherein the second compound is composed of materials having a positive CTE.

8. The semiconductor package of claim 7, wherein the first compound has a curved shape causes the second compound to experience a pre-formed tensile stress exerted by the first compound.

9. The semiconductor package of claim 8, wherein the pre-formed tensile stress is imposed on the second semiconductor die.

10. The semiconductor package of claim 8, wherein the pre-formed tensile stress in the second compound is configured to counter-balancing an external compression stress exerted by a user.

11. The semiconductor package of claim 7, further comprises a passive component disposed on the first side and the second side of the substrate, respectively.

12. The semiconductor package of claim 7, wherein the second compound has a curved shape configured to causes the first compound to experience a pre-formed compression stress exerted by the second compound.

13. The semiconductor package of claim 12, wherein the pre-formed compression stress is imposed on the first semiconductor die.

14. The semiconductor package of claim 12, wherein the pre-formed compression stress in the first compound is configured to counter-balancing an external tensile stress exerted by a user.

* * * * *